United States Patent [19]

Keser

[11] Patent Number: 4,650,107

[45] Date of Patent: Mar. 17, 1987

[54] METHOD FOR THE BUBBLE-FREE JOINING OF A LARGE-AREA SEMICONDUCTOR COMPONENT BY MEANS OF SOLDERING TO A COMPONENT PART SERVING AS SUBSTRATE

[75] Inventor: Helmut Keser, Birr, Switzerland

[73] Assignee: BBC Brown, Boveri & Company, Limited, Baden, Switzerland

[21] Appl. No.: 798,319

[22] Filed: Nov. 15, 1985

[30] Foreign Application Priority Data

Nov. 22, 1984 [DE] Fed. Rep. of Germany ....... 3442537

[51] Int. Cl.$^4$ ........................ B23K 1/12; B23K 35/12
[52] U.S. Cl. .................................. 228/123; 228/246; 228/249
[58] Field of Search ............... 228/252, 249, 123, 122, 228/189, 188, 246

[56] References Cited

U.S. PATENT DOCUMENTS 2,961,759  11/1960  Weissfloch .......................... 228/249
3,900,153   8/1975  Beerwerth et al. ................. 228/249
4,529,836   7/1985  Powers et al. ....................... 228/123

FOREIGN PATENT DOCUMENTS 174584  10/1984  Japan ..................................... 228/252

Primary Examiner—Nicholas P. Godici
Assistant Examiner—Samuel M. Heinrich
Attorney, Agent, or Firm—Oblon, Fisher, Spivak, McClelland & Maier

[57] ABSTRACT

A large-area semiconductor component (1) is joined without bubbles by means of soldering to a substrate (2) by placing a perforated metallic intermediate layer (5) between the solder (3) before the soldering and the substrate (2) and the assembly is brought to soldering temperature under pressure and perpendicular to the soldering plane. During this process, the solder (4) completely fills the cavities between the components (1, 2) and (5) after the soldering and drives gas bubbles and any impurities to the periphery of the assembly, a constant distance being maintained between the semiconductor component (1) and the substrate (2). The intermediate layer (5) is preferably constructed as structured foil or as metallic fabric.

5 Claims, 7 Drawing Figures

METHOD FOR THE BUBBLE-FREE JOINING OF A LARGE-AREA SEMICONDUCTOR COMPONENT BY MEANS OF SOLDERING TO A COMPONENT PART SERVING AS SUBSTRATE

BACKGROUND OF THE INVENTION

1. Field of the Invention

The invention is based on a method for the bubble-free joining of a semiconductor component to a component part serving as substrate according to the generic type.

2. Discussion of the Background

In the technology of power electronics, the semiconductor components, which can have considerable cross-sectional areas, must be placed in contact, that is to say joined with circuit continuity, with a substrate used for supplying the current.

This can be achieved in various ways:

(a) Bonding with a one- or two-component epoxy resin based conductive adhesive.

(b) Joining the component to the substrate by coating the latter with liquid solder and placing the former in floating manner onto the solder.

(c) Soldering with gold under pressure in a vacuum.

(d) Purely mechanical pressure contact: the component parts which are provided with plans metallic surfaces and pressed together under pressure are built into a case.

The conventional technologies lead to the following partially unsatisfactory results and inadequacies, particularly in the case of large-area components:

(i) Poor heat dissipation and non-uniform current distribution due to gas inclusions.

(ii) Uncontrollable thickness of the solder layer and non-uniform coating due to oxides and dust particles.

(iii) High material costs and risk of the formation of voids.

(iv) High material costs, expensive and elaborate construction methods.

In soldering methods similar to (b), the impurities can be squeezed outward by applying weights and using soldering gauges, but the soldering gap remains largely undefined and wedge errors occur.

The various soldering techniques are known from, among others, the following publications:

H. Parthey, "Boundary-Layer Problems during Soldering", Mitteilungen Forschungsgesellschaft Blechverarbeitung, 1965, No. 23/24, pages 365-367.

W. Leibfried, "Soldering of Chip Components", DVS Report, Volume 82, Munich 1983.

H. J. Hartmann, "Development of Reliable Contacting Methods using Soft Solders for Electronic Circuits, including Investigation of the Interface Reactions during Soft Soldering", Research Report of BMFT-FB T79-164. December 1979.

A need exists therefore for improving the conventional joining technologies to make them more reliable.

BRIEF DESCRIPTION OF THE DRAWINGS

The invention is based on the objective of specifying a soldering method for the bubble-free and non-porous joining of a large-area plane semi-conductor component to a metallic substrate, which guarantees good electrical conductivity and uniform current distribution and the execution of which is simple.

This object is achieved by the features specified in the characterising clause of claim 1.

Figure 1:
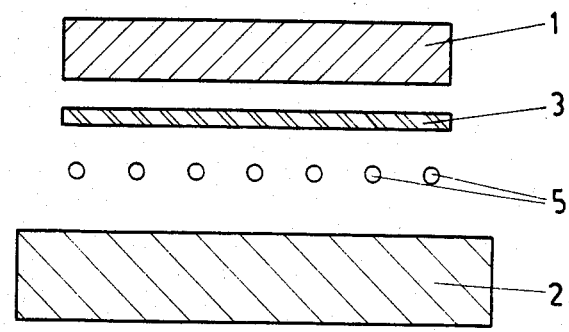
Figure 2:
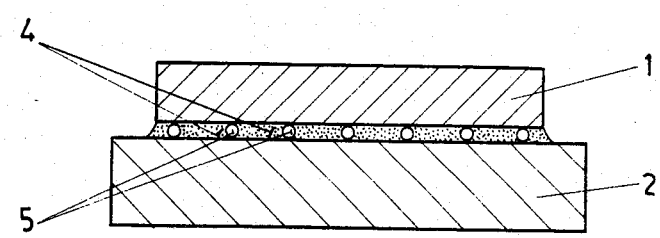
Figure 3:
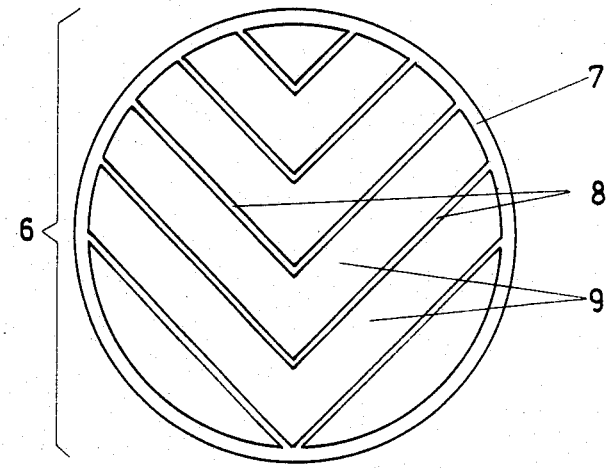
Figure 4:
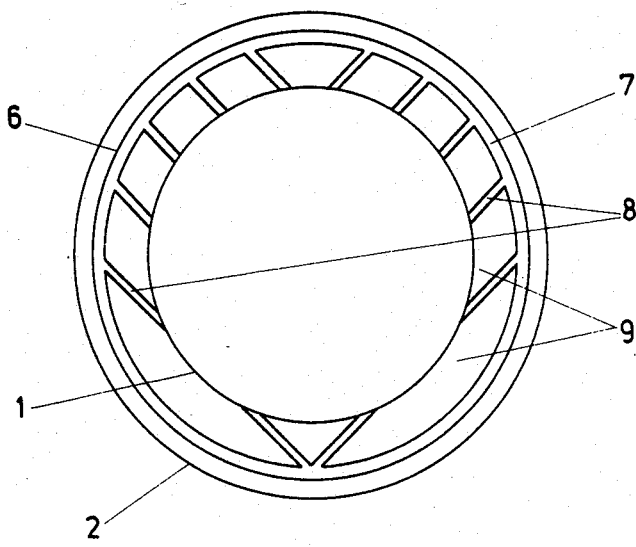
Figure 5:
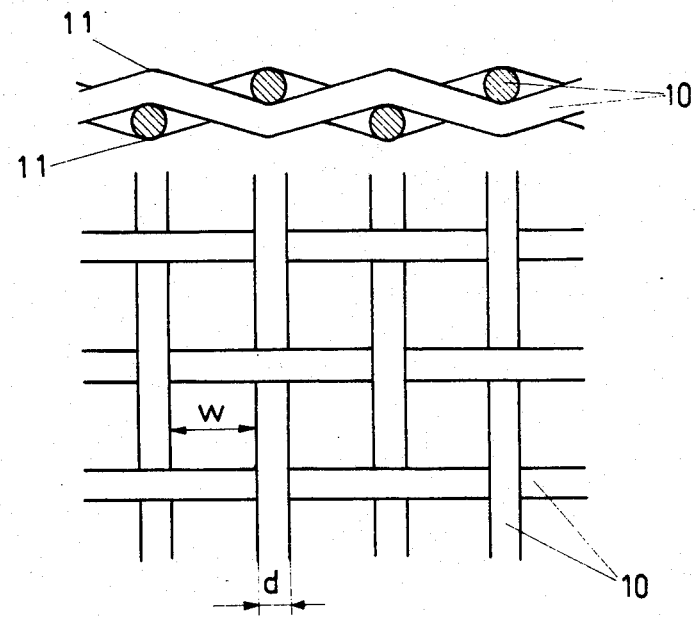
Figure 6:
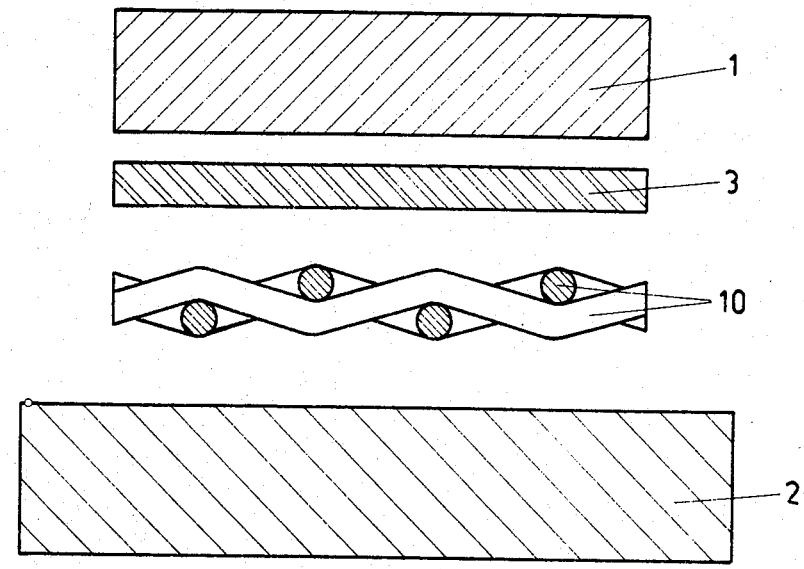
Figure 7:
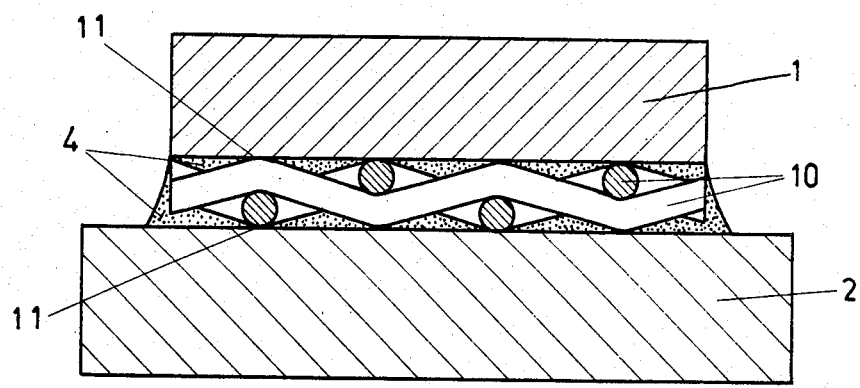

The invention is described by means of the illustrative embodiment which follows and which is explained in greter detail by figures, in which:

FIG. 1 shows a general diagrammatic section (elevation) through the components to be joined, before the soldering, FIG. 2 shows a general diagrammatic section (elevation) through the joined components after the soldering, FIG. 3 shows a plan view of an intermediate layer constructed as a structured foil, FIG. 4 shows a plan view of the components after the soldering, using a structured foil as intermediate layer, FIG. 5 shows a metallic fabric as intermediate layer in elevation/section and plan view, FIG. 6 shows a section (elevation) through the components to be joined before the soldering, using a metallic fabric as an intermediate layer, FIG. 7 shows a section (elevation) through the joined components after soldering, using a metallic fabric as an intermediate layer.

DETAILED DESCRIPTION OF THE PREFERRED EMBODIMENTS

FIG. 1 shows a general diagrammatic view of a section (elevation) of the components to be joined, before soldering. Component 1 is a large-area plane semiconductor component of mostly circular cross-section. Its thickness is shown greatly exaggerated in comparison with the diameter. 2 is the component part, the diameter of which is a little larger than that of the semiconductor component, is used as substrate 2 and is made of copper, a copper alloy or another suitable metallic material of high electrical conductivity. The solder 3, is formed as a foil, before the soldering. The reference symbol 5 designates the perforated metallic intermediate layer in a general diagrammatic way and is made and of Cu, Ag, Au and alloys thereof.

In FIG. 2, the components designed in FIG. 1 are shown in section (elevation) after the soldering in a general diagrammatic way. The solder 4 fills the intermediate space between the semiconductor component 1, the substrate 2 and the intermediate layer 5 after the soldering.

FIG. 3 shows a plan view of an intermediate layer constructed as structured foil 6. The circular foil 6 has at its outer circumference a support ring 7. The largest part of its area has been removed by being stamped or etched out so that, seen in a direction of observation perpendicular to the plane of soldering, V-shaped perforations 9 are formed which extend as far as the support ring 7 at the circumference and are used as ducts for deaerating the soldering gaps. The remaining, comparatively small webs 8, which are used as spacers, preferably have a width of 0.2 to 1 mm. The perforations 9 are preferably 2 to 5 mm wide and a spacing of 2.5 to 6 mm. Structured foil 6 preferably has a thickness of 0.1 to 0.2 mm.

FIG. 4 shows a plan view of the components after the soldering, using a structured foil 6 according to FIG. 3. The reference symbols exactly correspond to those of the previous FIGS. 1 and 3.

FIG. 5 shows a metallic fabric 10 as an intermediate layer in elevation/section and plan view. The clear mesh size w is preferably 0.4 to 1.0 mm and the corresponding wire diameter d is 0.1 to 0.2 mm. The support points, which are effective during the assembly and during the soldering process and which are under pressure, of the wires of the metallic fabric are given the reference sumbol 11.

FIG. 6 shows a section (elevation) through the components to be joined, before soldering, using a metallic fabric 10 according to FIG. 5. The remaining reference symbols correspond to those of FIG. 1.

FIG. 7 shows a section (elevation) through the joined components according to FIG. 6 after the soldering, using a metallic fabric 10 as an intermediate layer. After the soldering, the solder 4 completely and non-porously fills the intermediate spaces formed by 1, 2 and 10. During the soldering process, a certain axial load is applied perpendicularly to the soldering plane so that the support points 11 of the wires of the metallic fabric 10 exert a pressure with respect to components 1 and 2.

The intermediate layer or the surface of the semiconductor component to be joined or the surface of the substrate may be provided with a metallic coating, which promotes wetting, before the soldering process.

EXAMPLE

A semiconductor component has been joined to a component part by soft soldering. The supporting body of substrate 2 consisted of $Al_2O_3$, type Rubalit 705 (Messrs. Rosenthal) and had a circular cross-section of 50 mm diameter with a thickness of 0.6 mm. The two upper boundary areas were each covered with 0.2 mm of copper. Additionally, a nickel layer with a thickness of 10 $\mu$m (nickel bath according to Messrs. Shipley) was precipitated by currentless means onto the copper surface. A structured copper foil 6 with a thickness of 0.1 mm and an outside diameter of the support ring 7 of 55 mm and a corresponding inside diameter of 52 mm with a distance between adjacent webs 8 of 5 mm and a width of the webs 8 of 0.2 mm, was provided with a nickel layer with a thickness of 10 $\mu$m, also by currentless means. It must also be pointed out that in the present illustrative embodiment the outside diameter of the support ring 7 of the structured foil 6 was larger than the diameter of the substrate 2, in deviation from FIG. 4, so that the foil 6 projected over the substrate 2. However, this does not mean that the method is impaired, since the relative sizes of the components is not critical in this method. A foil of 0.1 mm width and 38 mm diameter with a composition of 95% Pb/5% Sn was used as solder. The semiconductor component 2 consisted of doped Si and had a circular cross-section. Its contact area was initially provided by vapour deposition under vacuum having a layer of Cr with a thickness of 150 Å. This was followed by a 2,000 Å-thick layer of Au, applied by the same method. The areas of the semiconductor component 1 and of the substrate 2 to be joined together were subsequently covered with a 5 $\mu$m-thick solder layer each (Pb and Sn content had the same composition as the solder foil), in accordance with the cathode sputtering method.

The various components were then placed on top of each other in a soldering furnace in the sequence specified:

Substrate 2
Soldering foil
Structured foil 6
Semiconductor component 1

The complete stack was then loaded with a weight of 500 g and brought to a temperature of 350° C. The atmosphere was a gas mixture of 15% hydrogen and 85% nitrogen. It is also pointed out that the sequence of components of the stack, which deviates from FIG. 1 in the present case, is not critical and does not play a role in the success of the method.

The invention is not restricted to the illustrative embodiment. The structured foil 6 can also have other dimensions or be replaced by a suitable metallic fabric 10 as the intermediate layer. See also the description of the figures (FIGS. 1 to 7).

The advantage of the method lies in its simplicity, operational reliability, freedom from voids and pores of the solder joint, uniform geometry and the current conduction of the end product produced by this method.

List of designations

| | |
|---|---|
| 1 | Semiconductor component |
| 2 | Substrate (component part) |
| 3 | Solder before soldering (solder foil) |
| 4 | Solder after soldering |
| 5 | Perforated metallic intermediate layer |
| 6 | Structured foil as intermediate layer |
| 7 | Support ring |
| 8 | Web |
| 9 | Perforation (part of the metallic intermediate layer stamped or etched out) |
| 10 | Metallic fabric as intermediate layer |
| 11 | Support point of the wire of the metallic fabric |
| d | Wire diameter |
| w | Clear mesh size of the metallic fabric |

I claim:

1. A method for the bubble-free joining of a large-area semiconductor component to a component part used as a substrate, comprising:
   (i) soldering by means of a solder foil, wherein a defined soldering gap is maintained between the semiconductor component and the substrate;
   (ii) maintaining said soldering gap constant throughout the soldering process by arranging a perforated metallic intermediate layer between the semiconductor component and the substrate, said perforated metallic intermediate layer having ducts for removing gases; and
   (iii) pressing on top of each other said semiconductor component, said perforated metallic intermediate layer, said solder foil and said substrate such that comparatively high pressures are generated at the respective support points of the perforated metallic intermediate layer.

2. The method according to claim 1, wherein a structured metal foil with a thickness of 0.1 to 0.2 mm is used as the intermediate layer which, seen in a direction of observation perpendicular to the soldering plane, has straight-line perforations, said perforations extending in a V-shape as far as a support ring delimiting the circumference, said perforations being used as ducts for deaerating the soldering gaps, and said perforations having a width of 2 to 5 mm and a spacing of 2.5 to 6 mm, said ducts being produced by stamping or etching and wherein the width of the remaining metal web is 0.2 to 1 mm.

3. The method according to claim 1, wherein a metallic fabric having a clear mesh size of 0.4 to 1.0 mm and a wire diameter of 0.1 to 0.2 mm is used as the intermediate layer.

4. The method according to claim 1, wherein a metal which is a member of the group consisting of Cu, Ag, Au and alloys thereof is used as the material for the intermediate layer.

5. The method according to claim 1, wherein the intermediate layer or the surface of the semiconductor component to be joined or the surface of the substrate is provided with a metallic coating, which promotes wetting, before the soldering process.

* * * * *